United States Patent
Ha et al.

(10) Patent No.: US 10,734,802 B2
(45) Date of Patent: Aug. 4, 2020

(54) DIRECT CURRENT DISTANCE PROTECTION SCHEMES

(71) Applicant: General Electric Technology GmbH, Baden (CH)

(72) Inventors: Hengxu Ha, Stafford (GB); Sankara Subramanian Sri Gopala Krishna Murthi, Stafford (GB)

(73) Assignee: General Electric Technology GmbH, Baden (CH)

( * ) Notice: Subject to any disclaimer, the term of this patent is extended or adjusted under 35 U.S.C. 154(b) by 277 days.

(21) Appl. No.: 15/573,936

(22) PCT Filed: May 12, 2016

(86) PCT No.: PCT/EP2016/060751
§ 371 (c)(1),
(2) Date: Nov. 14, 2017

(87) PCT Pub. No.: WO2016/180940
PCT Pub. Date: Nov. 17, 2016

(65) Prior Publication Data
US 2018/0294644 A1    Oct. 11, 2018

(30) Foreign Application Priority Data
May 14, 2015 (EP) ................... 15275138

(51) Int. Cl.
*H02H 7/26* (2006.01)
*G01R 19/25* (2006.01)
(Continued)

(52) U.S. Cl.
CPC ......... *H02H 7/265* (2013.01); *G01R 19/2513* (2013.01); *G01R 31/086* (2013.01);
(Continued)

(58) Field of Classification Search
USPC .................................................... 361/62–69
See application file for complete search history.

(56) References Cited

U.S. PATENT DOCUMENTS

| | | | | |
|---|---|---|---|---|
| 2014/0022680 | A1* | 1/2014 | Berggren | H02H 3/02 361/79 |
| 2015/0333503 | A1* | 11/2015 | Bermingham | H02H 7/268 361/62 |
| 2015/0338472 | A1* | 11/2015 | Nuqui | G01R 31/025 324/764.01 |

FOREIGN PATENT DOCUMENTS

| | | |
|---|---|---|
| DE | 198 19 219 C1 | 9/1999 |
| EP | 0 164 711 A2 | 12/1985 |
| WO | 2014/053174 A1 | 4/2014 |

OTHER PUBLICATIONS

Extended European Search Report and Opinion issued in connection with corresponding EP Application No. 15275138.4 dated Oct. 26, 2015.
(Continued)

*Primary Examiner* — Danny Nguyen
(74) *Attorney, Agent, or Firm* — Eversheds Sutherland (US) LLP

(57) ABSTRACT

A DC distance protection scheme for protecting a DC power transmission medium within the DC electrical power network. The DC distance protection scheme includes a protection device that is coupled in use to a DC power transmission medium. The protection device is operable to protect the DC power transmission medium from an electrical fault. The DC distance protection scheme also includes a measurement apparatus to selectively measure the current and voltage of the DC power transmission medium. In addition the DC distance protection scheme also includes a controller that is programmed to calculate an operating voltage of the DC power transmission medium using the
(Continued)

measured current and voltage; perform a transient comparison between the calculated operating voltage and the measured voltage; and operate the protection device to protect the DC power transmission medium if the transient comparison meets a predefined criterion.

12 Claims, 2 Drawing Sheets

(51) Int. Cl.
*G01R 31/50* (2020.01)
*G01R 31/08* (2020.01)
*H02H 1/00* (2006.01)
*H02H 3/20* (2006.01)
*H02H 7/28* (2006.01)
*H02H 3/28* (2006.01)

(52) U.S. Cl.
CPC ............ *G01R 31/50* (2020.01); *H02H 1/0007* (2013.01); *H02H 1/0092* (2013.01); *H02H 7/268* (2013.01); *H02H 3/20* (2013.01); *H02H 3/28* (2013.01); *H02H 7/262* (2013.01); *H02H 7/28* (2013.01)

(56) References Cited

OTHER PUBLICATIONS

International Search Report and Written Opinion issued in connection with corresponding PCT Application No. PCT/EP2016/060751 dated Jul. 27, 2016.
International Preliminary Report on Patentability issued in connection with corresponding PCT Application No. PCT/EP2016/060751 dated Nov. 14, 2017.

* cited by examiner

DIRECT CURRENT DISTANCE PROTECTION SCHEMES

FIELD OF INVENTION

Embodiments of the invention relate to a direct current (DC) distance protection scheme and a DC electrical network including a plurality of such schemes.

BACKGROUND OF THE INVENTION

DC electrical power networks, such as DC grids, typically include a plurality of terminals each of which may be operatively associated with a power converter to interconnect the DC power transmission network with a respective alternating current (AC) network.

Respective pairs of terminals are interconnected by a section of DC power transmission medium, such as a transmission line or cable. Protection devices, such as circuit breakers and relays, are operated in the event of a fault to protect the DC electrical power network.

SUMMARY OF INVENTION

According to a first aspect of embodiments of the invention there is a provided DC distance protection scheme for protecting a DC power transmission medium within a DC electrical power network, the DC distance protection scheme comprising: a protection device coupled in use to a DC power transmission medium, the protection device being operable to protect the DC power transmission medium from an electrical fault; a measurement apparatus to selectively measure the current and voltage of the DC power transmission medium; and a controller programmed to: calculate an operating voltage of the DC power transmission medium using the measured current and voltage; perform a transient comparison between the calculated operating voltage and the measured voltage; and operate the protection device to protect the DC power transmission medium if the transient comparison meets a predefined criterion.

The DC distance protection scheme of embodiments of the invention permits the detection of a fault and subsequent operation of a protection device, i.e. by way of a transient comparison between a calculated operating voltage and a measured voltage, in a manner which requires only a measured current and voltage of a DC power transmission medium to be obtained.

Such measurements can be obtained locally, i.e. immediately adjacent to the controller and protection device associated with a particular portion of DC power transmission medium, and so embodiments of the invention are able to protect an entire length of DC power transmission medium without the need to establish a communication link with one or more remote elements that would otherwise be required to provide an indication of a fault occurring a long distance away from the said controller and protection device.

The aforementioned functionality is especially desirable when the considerable length of a DC power transmission medium, e.g. several hundred kilometres, means that communication with one or more remote elements is unreliable, or the resulting delay in receiving information once communication is established is such that an associated protection device cannot be operated quickly enough to provide meaningful protection.

Moreover, the reliance solely on local current and voltage measurements permits the protection scheme of embodiments of the invention to operate the protection device extremely quickly, e.g. within 1 millisecond of a fault occurring.

In an embodiment, each of the protection device, the measurement apparatus and the controller is in use operatively associated with a first terminal of an associated DC electrical power network in which the DC power transmission medium is located, and the controller is programmed to calculate an operating voltage of the DC power transmission medium at a first point in the DC power transmission medium, the first point lying in a first section of the DC power transmission medium extending between the said first terminal and a second terminal of the associated DC electrical power network.

The foregoing arrangement desirably protects a first section of DC power transmission medium, e.g. such as might form part of a DC grid.

Optionally the first point is spaced from the first terminal by between 80% and 95% of the total length of the first section.

Locating the first point in the aforementioned manner helps to reliably discriminate between a fault within the first section of DC power transmission medium and a fault in some other section of the DC power transmission medium which might, e.g. form a further part of a DC grid.

In an embodiment of the invention each of the protection device, the measurement apparatus and the controller is in use operatively associated with a first terminal of an associated DC electrical power network in which the DC power transmission medium is located, and the controller is programmed to calculate an operating voltage of the DC power transmission medium at a second point in the DC power transmission medium, the second point lying in a second section of the DC power transmission medium extending between second and third terminals of the associated DC electrical power network, the second terminal being spaced from the said first terminal of the DC electrical power network by a first section of the DC power transmission medium.

Having the controller programmed to calculate an operating voltage of the DC power transmission medium at the said second point further helps to discriminate between a fault within a first section of DC power transmission medium, i.e. as extends between the first and second terminals, and a fault in the second section of the DC power transmission medium between the second and third terminals.

The second point may be spaced from the second terminal by between 20% and 50% of the total length of the second section.

Arranging the second point in this way desirably helps to reliably discriminate between a fault within the aforementioned first section of DC power transmission medium and a fault in the said second section of the DC power transmission medium between the second and third terminals.

Optionally the controller is programmed to calculate an operating voltage using one of following models of the DC power transmission medium: a resistance-inductance model; a distributed parameter line model; and a frequency dependent distributed parameter line model.

Each of the foregoing models provides a desired degree of accuracy, in terms of the manner in which it approximates the performance characteristics of the DC power transmission medium, according to the overall length of the DC power transmission medium.

In an embodiment, the controller is programmed to perform a transient comparison between the calculated operating voltage and the measured voltage using one of: a magnitude comparison of the said voltages; and a correlation of the said voltages.

Such transient comparisons can be readily carried out by a controller in the form of, e.g. a programmable microcontroller or the like.

The controller may be programmed when correlating the said voltages to compare a resulting correlation coefficient against a threshold and to operate the protection device when the correlation coefficient is below the threshold.

Programming the controller in such a manner helps to ensure that the controller is able reliably and repeatedly to discriminate between a fault in a first section of DC power transmission medium and a fault in some other section of the DC power transmission medium, and thereby avoid unwanted operation of the protection device.

In embodiments of the invention the controller is programmed to operate the protection device if a first transient comparison with respect to a first calculated operating voltage at the first point in the DC power transmission medium meets a predefined criterion or a second transient comparison with respect to a second calculated operating voltage at the second point in the DC power transmission medium meets a predefined criterion.

Having the controller programmed in the foregoing manner allows the DC distance protection scheme of embodiments of the invention to discriminate between faults in the first and second sections of DC power transmission medium, as well as provide the option of the DC distance protection scheme of embodiments of the invention acting as backup protection to, e.g. a further DC distance protection scheme according to embodiments of the invention associated with the second section of DC power transmission medium.

The controller may be further programmed to delay operating the protection device when the second transient comparison meets the predefined criterion.

Configuring the controller in this way helps to avoid erroneous operation of the protection device when a fault occurs in a second section of DC power transmission medium which is protected by a second DC distance protection scheme essentially identical to that of embodiments of the invention.

Optionally the controller is additionally programmed to operate the protection device upon receipt of an external trip signal.

Such a configuration extends the functionality of the protection scheme of embodiments the invention in circumstances where modest communication between, e.g. remote terminals in a DC electrical power network, is possible.

According to an aspect of the invention there is provided a DC electrical power network comprising a plurality of DC distance protection schemes as described hereinabove.

Such a DC electrical power network shares the benefits associated with the DC distance protection schemes included therein.

BRIEF DESCRIPTION OF THE DRAWINGS

There now follows a brief description of embodiments of the invention, by way of non-limiting examples, with reference being made to the following drawings in which.

DETAILED DESCRIPTION

Figure 1:
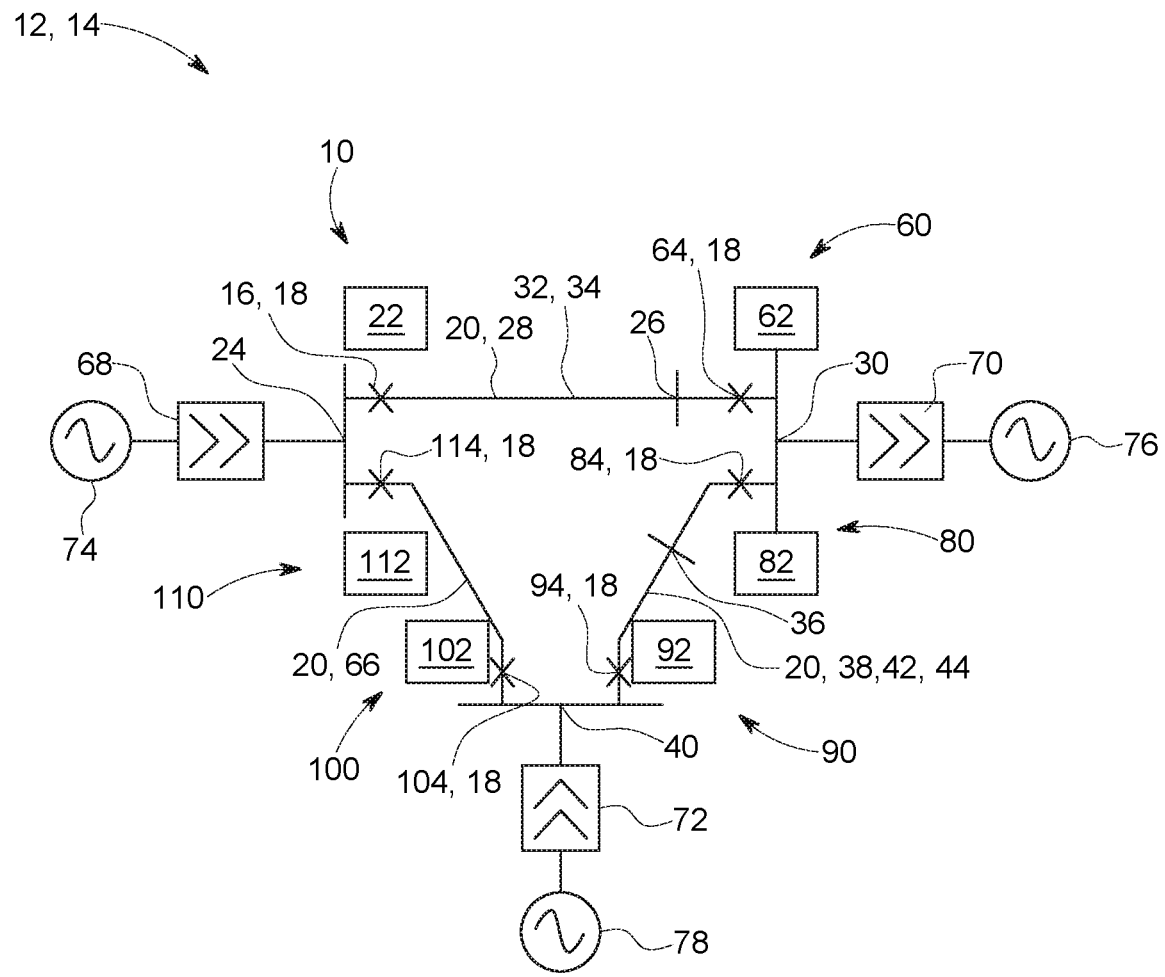
FIG. 1 shows a schematic view of a DC electrical power network including a plurality of DC distance protection schemes.

A DC distance protection scheme according to a first embodiment of the invention is designated generally by reference numeral 10 and forms part of a DC electrical power network 12 in the form of a DC grid 14, as shown schematically in FIG. 1.

The first DC distance protection scheme 10 includes a first protection device 16 which, in the embodiment shown is a circuit breaker 18, although other types of protection devices such as a relay are also possible. The protection device 16, i.e. circuit breaker 18, is electrically coupled in use to a DC power transmission medium 20, i.e. arranged in-line with the DC power transmission medium 20, and is operable to protect the DC power transmission medium 20 from an electrical fault.

The DC distance protection scheme 10 also includes a first measurement apparatus (not shown) which is able to selectively measure the current and voltage of the DC power transmission medium 20.

In addition, the DC distance protection scheme 10 includes a first controller 22 that is programmed to: calculate an operating voltage of the DC power transmission medium 20 using the measured current and voltage; perform a transient comparison between the calculated operating voltage and the measured voltage; and operate the first protection device 16 to protect the DC power transmission medium 20 if the transient comparison meets a predefined criterion.

More particularly, each of the first protection device 16, the first measurement apparatus and the first controller 22 is operatively associated with a first terminal 24 of the DC electrical power network 12, and the first controller 22 is programmed to calculate an operating voltage uop1 of the DC power transmission medium 20 at a first point 26 in the DC power transmission medium 20.

The first point 26 lies in a first section 28 of the DC power transmission medium 20 that extends between the first terminal 24 and a second terminal 30 of the DC electrical power network 12, i.e. the DC grid 14. In the embodiment shown, the first section 28 of the DC power transmission medium 20 is defined by a first transmission line 32, and more particularly by a first bi-polar transmission line 34, i.e. a transmission line incorporating two conductors (not shown) operating at different polarities. In other embodiments (not shown) the first section 28 of the DC power transmission medium 20 may instead be defined by a first transmission cable which may or may not be bi-polar and could be mono-polar, i.e. could incorporate a single conductor operating at a single polarity. The first section 28 could also be defined by a mono-polar transmission line.

The first point 26 is spaced from the first terminal 24 by between 80% and 95% of the total length of the first section 28, i.e. of the total length of the first bi-polar transmission line 34, such that the first point lies a first distance $D_{Set}^{1}$ from the first terminal 24.

In addition to the foregoing, the first controller 22 is also programmed to calculate an operating voltage $u_{op}^{2}$ of the DC power transmission medium 20 at a second point 36 in the DC power transmission medium 20.

The second point 36 lies in a second section 38 of the DC power transmission medium 20 that extends between the second terminal 30 and a third terminal 40 in the DC electrical power network 12.

The second section 38 of the DC power transmission medium 20 is similarly defined by a second transmission line 42 in the form of a second bi-polar transmission line 44. In further embodiments of the invention the second section 38 may be mono-polar, and may be defined by a transmission cable or other medium.

The second point 36 is spaced from the second terminal 30 by between 20% and 50% of the total length of the second section 38 of the DC power transmission medium 20, i.e. of the total length of the second bi-polar transmission line 44. As a consequence the second point 36 lies a second distance $D_{Set}^2$ away from the first terminal 24, with the second distance $D_{Set}^2$ being made up of the total length of the first section 28 of the DC power transmission medium 20 together with the aforementioned 20% to 50% of the length of the second section 38.

The first controller 22 is programmed to separately calculate the operating voltage $u_{op}^1$, $u_{op}^2$ of the DC power transmission medium 20 at each of the first and second points 26, 36. Such calculations utilise current and voltage values that are measured at the first terminal 24, i.e. the terminal with which the first controller 22 is operatively associated.

Since each of the first and second sections 28, 38 of DC power transmission medium 20 is defined by a respective bi-polar transmission line 34, 44, measured samples of positive voltage $u_{mP}(n)$ and positive current $i_{mP}(n)$, as well as negative voltage $u_{mN}(n)$ and negative current $u_{mN}(n)$ can be obtained. Moreover, the sampling period Ts may, for example, be given by:

$$Ts = 1/96000 \text{ seconds}$$

If such positive and negative samples are to be taken it is necessary thereafter for the first controller 22 to calculate voltage $u_{m1}$, $u_{m0}$ and current values $i_{m1}$, $i_{m0}$ for each of a first positive mode $m_1$ (which may also be known as an 'aerial' mode) and a second zero—mode $m_0$ (which may also be known as an 'earth' mode) according to the following phase-mode transformation:

$$\begin{cases} u_{m1} = u_{mP} - u_{mN} & i_{m1} = i_{mP} - i_{mN} \\ u_{m0} = u_{mP} + u_{mN} & i_{m0} = i_{mP} + i_{mN} \end{cases}$$

where, $u_{mP}$ is the measured voltage of the positive polar line; $i_{mP}$ is the measured current of the positive polar line; $u_{mN}$ is the measured voltage of the negative polar line; and $i_{mN}$ is the measured current of the negative polar line.

In embodiments of the invention operatively associated with first and second sections 28, 38 of DC power transmission medium 20 that are defined by mono-polar transmission lines or cables, the first controller 22 need not be programmed to carry out the aforementioned phase-mode transformation.

Following the phase-mode transformation mentioned above, the first controller 22 is programmed to then separately calculate a first operating voltage $u_{op}^1$ of the DC power transmission medium 20 at the first point 26 and a second operating voltage $u_{op}^2$ of the DC power transmission medium 20 at the second point 36.

In the embodiment shown the first controller 22 is programmed to calculate each of the first and second operating voltages $u_{op}^1$, $u_{op}^2$ using a resistance-inductance model of the DC power transmission medium 20. Such a model is particularly suitable, i.e. provides a desired degree of accuracy, if each of the first and second bi-polar transmission lines 34, 44 is relatively short, e.g. less than approximately 100 km (or less than approximately 30 km if the DC power transmission medium 20 is instead defined by an underground transmission cable).

Figure 2:
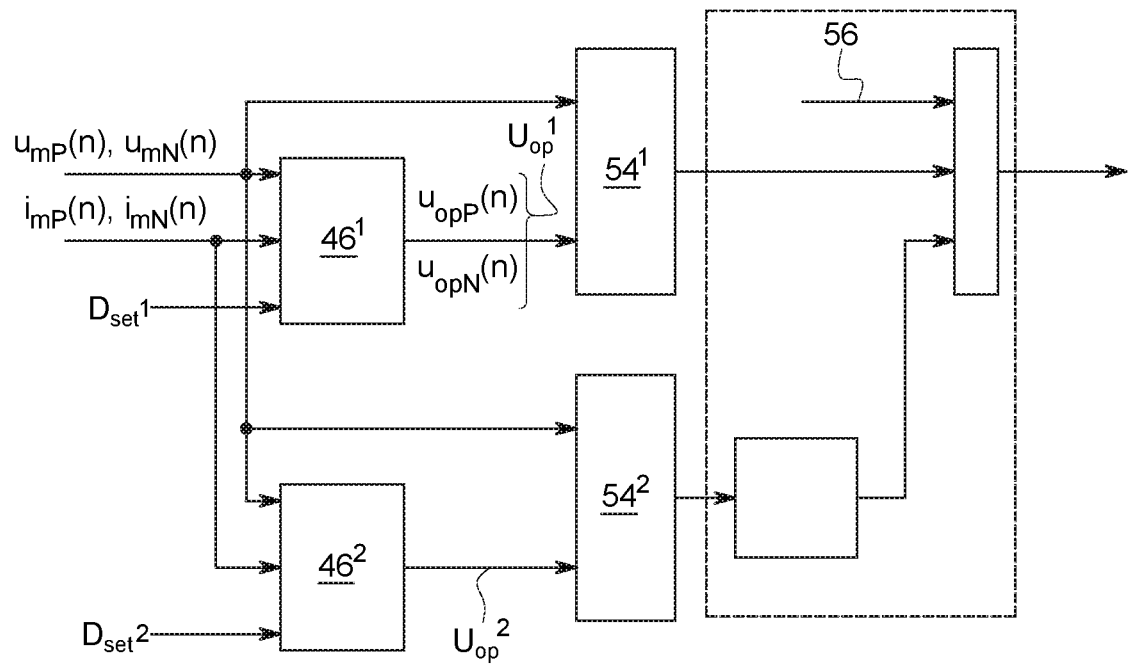
FIG. 2 shows a schematic representation of a controller forming a part of each of the DC distance protection schemes shown in FIG. 1.

More particularly, the first controller 22 includes first and second operating voltage calculation blocks $46^1$, $46^2$, as shown in FIG. 2, each of which handles the aforementioned phase-mode transformation and the calculation of a corresponding one of the first and second operating voltages $u_{op}^1$, $u_{op}^2$.

Each such calculation of the respective first and second operating voltages $u_{op}^1$, $u_{op}^2$ is based on the differential equation, $$u_{op}(t) = u_m(t) - R_{set} i_m(t) - L_{set} \frac{di_m(t)}{dt}$$

which can be implemented by:

$$u_{op}(n) = \frac{[u_m(n) + u_m(n-1)]}{2} - R_{set} \frac{[i_m(n) + i_m(n-1)]}{2} - L_{set} \frac{[i_m(n) - i_m(n-1)]}{T_s}$$

where, $u_{op}$ gives the corresponding positive or zero mode operating voltage $u_{op1}$, $u_{op0}$ at a respective first or second point 26, 36; $u_m$ is the positive or zero mode of measured voltage $u_{m1}$, $u_{m0}$, respectively; $i_m$ is the positive or zero mode of measured current $i_{m1}$, $i_{m0}$, respectively; $R_{set}$ is the resistance of the DC power transmission medium 20 from the first terminal 24 to the corresponding first or second point 26, 36, i.e. $R_{set}^1$ is the resistance of the first section 28 of DC power transmission medium 20, i.e. the first bi-polar transmission line 32, from the first terminal 24 to the first point 26, and $R_{set}^2$ is the resistance of the whole of the first section 28 plus the resistance of the second section 38 of DC power transmission medium 20, i.e. the second bi-polar transmission line 32, from the second terminal 30 to the second point 36; and $L_{set}$ is the inductance of the DC power transmission medium 20 from the first terminal 24 to the corresponding first or second point 26, 36, i.e. $L_{set}^1$ is the inductance of the first section 28 of DC power transmission medium 20, i.e. the first bi-polar transmission line 32, from the first terminal 24 to the first point 26, and $L_{set}^2$ is the inductance of the whole of the first section 28 plus the inductance of the second section 38 of DC power transmission medium 20, i.e. the second bi-polar transmission line 32, from the second terminal 30 to the second point 36.

Each of the resistance and inductance values $R_{set}$, $L_{set}$ mentioned above can be established from technical data on the DC power transmission medium 20, e.g. as provided by the operator of the DC electrical power network 12, and the known first and second distances $D_{Set}^1$, $D_{Set}^2$ of the corresponding first and second points 26, 36 from the first terminal 24.

Thereafter, because each of the first and second sections 28, 38 of DC power transmission medium 20 is defined by a respective bi-polar transmission line 34, 44, it is necessary for the first controller 22 to determine the actual operating voltage $u_{opP}$, $u_{opN}$ of each of the positive and negative lines of the transmission lines 34, 44.

The first controller 22 is programmed to do this by reversing the aforementioned phase-mode transformation, i.e. according to:

$$\begin{cases} u_{opP} = u_{op1} + u_{op0} \\ u_{opN} = u_{op1} - u_{op0} \end{cases}$$

Again, in embodiments of the invention operatively associated with first and second sections 28, 38 of DC power transmission medium 20 that are defined by mono-polar transmission lines or cables the first controller 22 need not be programmed to carry out the aforementioned reverse phase-mode transformation.

Figure 3:
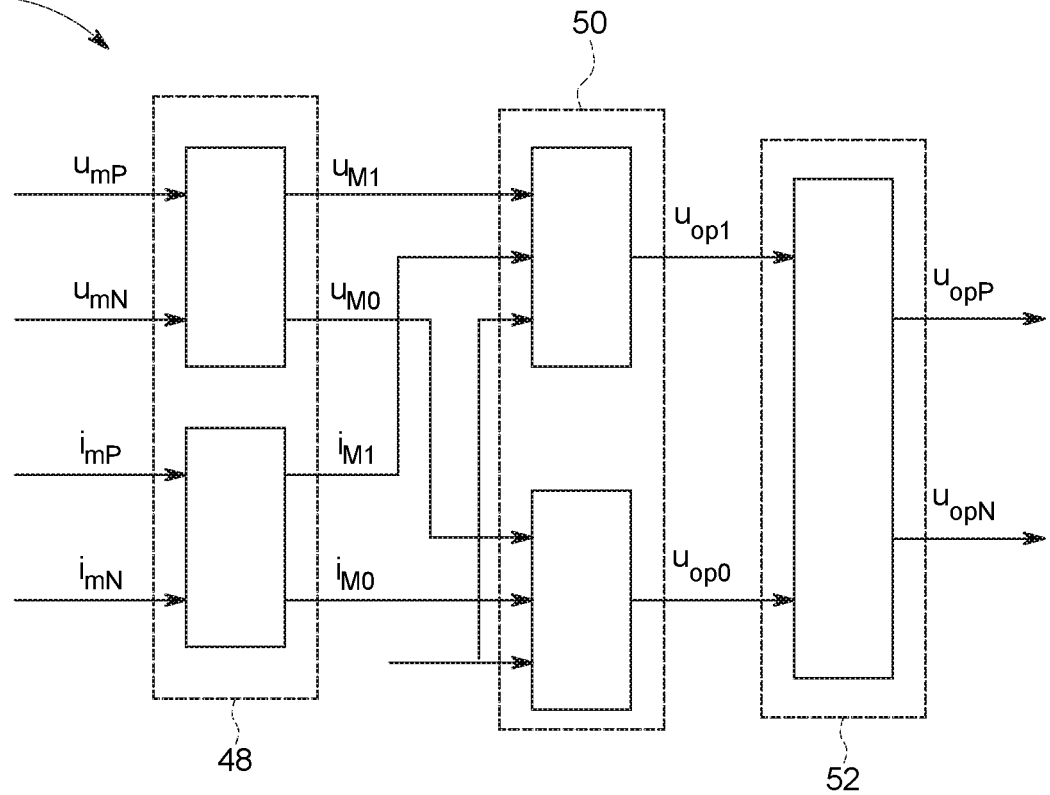
FIG. 3 shows a schematic representation of an operating voltage calculation block that forms a part of the controller shown in FIG. 2.

A summary of the operations that each of the operating voltage calculation blocks $46^1$, $46^2$ of the first controller 22 is programmed to carry out is shown schematically in FIG. 3.

In particular, FIG. 3 shows that each operating voltage calculation block $46^1$, $46^2$ includes: a phase-mode transformation sub-block 48 that calculates voltage $u_{m1}$, $u_{m0}$ and current values $i_{m1}$, $i_{m0}$ for each of the positive mode $m_1$ and the zero mode $m_0$; a voltage calculation sub-block 50 that gives the positive and zero mode operating voltage $u_{op1}$, $u_{op0}$ at the respective first or second point 26, 36 of interest; and a reverse phase-mode transformation sub-block 52 that determines the actual operating voltage $u_{opP}$, $u_{opN}$ of each of the positive and negative lines at the said first or second point 26, 36 of interest.

In other embodiments of the invention (not shown) the first controller 22 may instead be programmed to calculate the operating voltage $u_{op}$ at one or other of the first and second points 26, 36 by using either a distributed parameter line model of the DC power transmission medium 20 or a frequency dependent distributed parameter line model of the DC power transmission medium 20.

In embodiments in which the first controller 22 is programmed to calculate the operating voltage $u_{op}$ using a distributed parameter line model of the DC power transmission medium 20, it is assumed that the parameters of the frequencies are the same as those of one representative frequency, e.g. 50 Hz, or 100 Hz, such that $$u_{op}(t-T_p) = [K_p f_m(t-2T_p) + b_m(t)/K_p]/2$$

where, $u_{op}$ is the operating voltage; $f_m$ is the forward voltage traveling wave at the location of protection device 16, i.e. at the first terminal 24; and $b_m$ is backward voltage traveling wave at the location of protection device 16, i.e. at the first terminal 24 with $f_m$ and $b_m$ being given by:

$$\begin{cases} f_m(t) = u_m(t) + Z_c i_m(t - T_z) \\ b_m(t) = u_m(t) - Z_c i_m(t - T_z) \end{cases}$$

where, $Z_c = |\sqrt{z/y}|$ is the surge impedance, which is calculated by the impedance z (ohm/km) and admittance y (S/km) per unit of the first and/or second transmission lines 32, 42, as required;

$$T_z = \text{phase}\left(\sqrt{\frac{z}{y}}\right) / \omega_0$$

where $\omega_0$ is the representative frequency, i.e. the frequency at which the DC electrical power network 12 is operating; $T_p = \text{imag}(D_{set}\sqrt{zy})/\omega_0$ is the propagation time from where the protection device 16 is located, i.e. the first terminal 24, to the corresponding first or second point 26, 36 of interest with $D_{set}$ being the equivalent distance in km of the first or second point 26, 36 from the first terminal 24, i.e. the first distance $D_{set}^1$ or the second distance $D_{set}^2$ as described hereinabove; $K_p = \exp(-\text{real}(D_{set}\sqrt{zy}))$, is the decaying factor from where the protection device 16 is located, i.e. the first terminal 24, to the corresponding first or second point 26, 36 of interest.

The performance values mentioned above can again be established from technical data provided by the operator of the DC electrical power network 12, and the known first and second distances $D_{set}^1$, $D_{set}^2$ of the first and second points 26, 36 from the first terminal 24.

As an alternative, if the first and second transmission lines 32, 42 are not in distortion, the main equations set out above may again be utilized but the following parameters may instead be calculated: $Z_c = \sqrt{L/C}$ is the surge impedance, with L being the inductance (H/km) and C being the capacitance (F/km) per unit length of the transmission lines 32, 42; $T_z = 0$, i.e. the phase shift of the surge impedance is neglected; $T_p = D_{set}/(1/\sqrt{LC})$, is the propagation time from where the protection device 16 is located, i.e. the first terminal 24, to the corresponding first or second point 26, 36 of interest; $K_p = \exp(-RD_{set}/Z_c)$, is the decaying factor from where the protection device 16 is located, i.e. the first terminal 24, to the corresponding first or second point 26, 36 of interest, with R being the resistance per unit length (ohm/km) of the transmission lines 32, 34.

Similarly these performance values can again be established from technical data provided by the operator of the DC electrical power network 12, and the known first and second distances $D_{set}^1$, $D_{set}^2$ of the first and second points 26, 36 from the first terminal 24.

In any event, having the first controller 22 programmed to calculate the operating voltage $u_{op}$ using a distributed parameter line model of the DC power transmission medium 20 is helpful for longer transmission lines 32, 42, i.e. lines between approximately 100 km and 200 km, (or between approximately 30 km and 80 km if the DC power transmission medium 20 is defined by an underground cable), since it is able to take account of any propagation time delay of a voltage waveform travelling within the lines.

In further embodiments, in which the first controller 22 is programmed to calculate the operating voltage $u_{op}$ using a frequency distributed parameter line model of the DC power transmission medium 20, the first controller 22 first of all calculates a forward traveling wave $f_m$ and a backward traveling wave $b_m$ according to the following equations:

$$f_m(t) = u_m(t) + Z_c(t) * i_m(t)$$

$$b_m(t) = u_m(t) - Z_c(t) * i_m(t)$$

where, $Z_c(t)$ is the surge impedance which is frequency-dependent, and which can be described in the frequency domain by $$Z_c(z) = Z_{c0} \frac{1 + a_1 z^{-1} + \ldots + a_N z^{-N}}{1 + b_1 z^{-1} + \ldots + b_N z^{-N}}$$

with $Z_{c0}$ being the constant part of the surge impedance; and $a_k$ and $b_k$ being coefficients of the surge impedance in frequency domain $Z_c(z)$ The aforesaid $a_k$ and $b_k$ coefficients can be calculated by Carlson's equation from technical data on the DC power transmission medium 20, e.g. as provided by the operator of the DC electrical power network 12.

Meanwhile the symbol * represents the mathematical operation of convolution, wherein it can be assumed that the surge impedance $z_c$ has 3 orders.

The first controller 22 then secondly calculates the forward and backward traveling waves $f_{op}$, $b_{op}$ at the respective first or second point 26, 36 of interest according to:

$$f_{op}(t-T_{pSet}) = f_m(t-2T_{pSet}) * h_{Set}(t)$$

$$b_{op}(t-T_{pSet}) = b_m(t) * h_{Set}^{-1}(t)$$

where, $Tp_{Set}$ is the minimum propagation time from where the protection device 16 is located, i.e. the first terminal 24, to the location of the corresponding first or second point 26, 36 of interest; $h_{Set}$ (t) is the propagation function for a traveling wave from where the protection device 16 is located, i.e. from the first terminal 24, to the location of the corresponding first or second point 26, 36 of interest, which can be described in the frequency domain by $$H_{Set}(z) = \frac{c_0 + c_1 z^{-1} + \ldots + c_{N-1} z^{-(N-1)}}{1 + d_1 z^{-1} + \ldots + d_N z^{-N}}$$

with, $c_k$ and $d_k$ being coefficients of the propagation function $H_{Set}(s)$.

The foregoing $c_k$ and $d_k$ coefficients can again be calculated by Carlson's equation from technical data provided by the operator of the DC electrical power network 12.

Finally the first controller 22 calculates the operating voltage according to:

$$u_{op} = f_{op} + b_{op}$$

Having a first controller 22 programmed to calculate the operating voltage $u_{op}$ using a frequency dependent distributed parameter line model of the DC power transmission medium 20 is helpful for extra-long transmission lines 32, 42, i.e. lines more than approximately 200 km long (or more than 80 km long if the DC if the DC power transmission medium 20 is defined by an underground cable), since it is able to take into account frequency-dependent parameters (such as, for example, the skin effect) which distort to a considerable extent the waveform of traveling waves in transmission lines of such length.

Meanwhile, returning to the embodiment shown, the first controller 22 is programmed to perform a transient comparison between the calculated operating voltage $u_{op}$ and the measured voltage $u_m$ using a magnitude comparison of the said voltages $u_{op}$, $u_m$.

More particularly the first controller 22 includes, for each of the first and second points 26, 36, a corresponding first and second transient phase comparison block $54^1$, $54^2$ to carry out the said magnitude comparison.

More particularly still, because each of the first and second sections 28, 38 of DC power transmission medium 20 is defined by a respective bi-polar transmission line 34, 44, each said transient phase comparison block $54^1$, $54^2$ carries out the following comparisons:

$$\|u_{opP} + u_{mP}\| < \|u_{opP} - u_{mP}\|$$

$$\|u_{opN} + u_{mN}\| < \|u_{opN} - u_{mN}\|$$

where $\| \|$ indicates an RMS value, i.e. as given by:

$$\|x(n)\| = \sqrt{\frac{1}{W} \sum_{k=0}^{W-1} |x(n-k)|^2}$$

with, W being the time window length, e.g. if the time window is 0.5 ms and the sampling period Ts is, as set out above, $\frac{1}{96000}$, then the window length is given by $$W = 0.0005/(\frac{1}{96000}) = 48.$$

In other embodiments of the invention $\| \|$ may indicate a sum of the absolute value, i.e. as given by:

$$\|x(n)\| = \frac{1}{W} \sum_{k=0}^{W-1} |x(n-k)|$$

where, W is again the time window length.

In either case, if the transient comparison meets the predefined criterion, i.e. if one of the aforementioned comparisons hold true $$\|u_{opP} + u_{mP}\| < \|u_{opP} - u_{mP}\|; \text{ or}$$

$$\|u_{opN} + u_{mN}\| < \|u_{opN} - u_{mN}\|$$

then the first controller 22 operates the first protection device 16.

In other embodiments of the invention operatively associated with first and second sections 28, 38 of DC power transmission medium 20 defined by mono-polar transmission lines or cables, a corresponding first or second transient phase comparison block $54^1$, $54^2$ of the first controller 22 need only carry out a simpler magnitude comparison of the form:

$$\|u_{op} + u_m\| < \|u_{op} - u_m\|$$

to determine whether to operate the first protection device 16.

In similar such mono-polar embodiments of the invention, the first controller 22 may instead be programmed to perform a transient comparison between the calculated operating voltage $u_{op}$ and the measured voltage $u_m$ using a correlation of the said voltages $u_{op}$, $u_m$.

As a result of programming in this manner, such first controllers 22 correlate the operating voltage $u_{op}$ and measured voltage $u_m$ signals to establish a correlation coefficient of the form:

$$R_{Cor}(n) = \frac{\sum_{k=n-W+1}^{n} u_{op}(k) u_m(k)}{\sqrt{\sum_{k=n-W+1}^{n} u_{op}^2 \sum_{k=n-W+1}^{n} u_m^2}}$$

where, W is again the time window length.

Thereafter, such first controllers 22 compare the resulting correlation coefficient $R_{Cor}$ against a threshold $R_{set}$ and will operate the first protection device 16 when the correlation coefficient $R_{Cor}$ is below the threshold $R_{set}$, i.e. when the predefined criterion is:

$$R_{Cor}(n) < R_{set}$$

By way of example, $R_{set}$ may have a value of −0.5.

Respective correlation of positive operating voltage $u_{opP}$ and positive measured voltage $u_{mP}$, or correlation of negative operating voltage $u_{opN}$ and negative measured voltage $u_{mN}$, may also be carried out by controllers in other embodiments of the invention.

Returning to the specific embodiment shown and described in detail above, i.e. wherein the first controller 22 is programmed to carry out a first transient comparison with respect to the first calculated operating voltage $u_{op}^1$ at the first point 26 in the DC power transmission medium 20, and also carry out a second transient comparison with respect to the second calculated operating voltage $u_{op}^2$ at the second point 36 in the DC power transmission medium 20, the first controller 22 is programmed in use to operate the first protection device 16 if either the first transient comparison or the second transient comparison meets the predefined criterion, i.e. satisfies the aforementioned magnitude comparison.

Furthermore, the first controller 22 is additionally programmed to delay operating the first protection device 16 when the second transient comparison meets the predefined criterion. Such a delay may amount to around 5 to 10 ms.

In addition, the first controller 22 will operate the first protection device 16 upon receipt of an external trip signal 56, e.g. from a second controller 62 associated with the second terminal 30 at the other end of the first section 28 of DC power transmission medium 20 and configured to operate a second protection device 64 in the form of a further circuit breaker 18. In this manner the second controller 62 and second protection device 64, along with a second measurement apparatus (not shown), together define a second DC protection scheme 60 which provides overlapping protection for the first section 28 of DC power transmission medium 20.

The DC electrical power network shown in FIG. 1 also additionally includes a third section 66 of DC power transmission medium 20 which extends between the third terminal 40 and the first terminal 24. Each terminal 24, 30, 40 electrically interconnects a corresponding first, second or third power converter 68, 70, 72 and associated first, second or third AC network 74, 76, 78 via the aforementioned DC electrical network 12, i.e. the aforementioned DC grid 14.

The second terminal 30 also has a third DC protection scheme 80 operatively associated therewith, with the third DC protection scheme 80 including a third controller 82, a third protection device 84 (in the form of a still further circuit breaker 18), and a third measurement apparatus (not shown).

In a similar manner, the third terminal 40 has a fourth DC protection scheme 90 operatively associated therewith, with the fourth DC protection scheme 90 again similarly including a fourth controller 92, a fourth protection device 94 (in the form of a yet further circuit breaker 18), and a fourth measurement apparatus (not shown).

The third and fourth DC protection schemes 80; 90 provide overlapping protection for the second section 38 of DC power transmission medium 20.

The third terminal 40 additionally has a fifth DC protection scheme 100 operatively associated therewith (which includes a commensurate fifth controller 102, fifth protection device 104 (again a circuit breaker 18), and fifth measurement apparatus (not shown)), while the first terminal 24 has a sixth DC protection scheme 110 operatively associated therewith (similarly with a commensurate sixth controller 112, sixth protection device 114 (again a circuit breaker 18), and sixth measurement apparatus (again not shown)).

The fifth and sixth DC protection schemes 100; 110 provide overlapping protection for the third section 66 of DC power transmission medium 20.

In the embodiment of the DC electrical power network 12, i.e. DC grid 14, shown in FIG. 1, each of the second, third, fourth, fifth and sixth DC protes 60; 80; 90; 100; 110 is identical to the first DC protection scheme 10 described hereinabove. In other embodiments, however, one or more of the DC protection schemes 10; 60; 80; 90; 100; 110 may include a corresponding controller 22, 62; 82, 92, 102, 112 that is programmed according to one or more of the alternative configurations described herein. In any event, however, the various DC protection schemes 10; 60; 80; 90; 100; 110 work with one another to provide additional, overlapping protection for the first, second and third sections 28, 38, 66 of the DC power transmission medium 20.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A DC distance protection scheme for protecting a DC power transmission medium within a DC electrical power network, the DC distance protection scheme comprising:
   a protection device coupled in use to the DC power transmission medium, the protection device being operable to protect the DC power transmission medium from an electrical fault;
   a measurement apparatus to selectively measure the current and voltage of the DC power transmission medium; and
   a controller programmed to:
      calculate an operating voltage of the DC power transmission medium using the measured current and measured voltage;
      perform a transient comparison between the calculated operating voltage and the measured voltage; and
      operate the protection device to protect the DC power transmission medium if the transient comparison meets a predefined criterion; wherein each of the protection device, the measurement apparatus and the controller is in use operatively associated with a first terminal of an associated DC electrical power network in which the DC power transmission medium is located, and the controller is programmed to calculate the operating voltage of the DC power transmission medium at a first point in the DC power transmission medium, the first point lying in a first section of the DC power transmission medium extending between the said first terminal and a second terminal of the associated DC electrical power network.

2. The DC distance protection scheme according to claim 1 wherein each of the protection device, the measurement apparatus and the controller is in use operatively associated with a first terminal of an associated DC electrical power network in which the DC power transmission medium is located, and the controller is programmed to calculate an operating voltage of the DC power transmission medium at a first point in the DC power transmission medium, the first point lying in a first section of the DC power transmission medium extending between the first terminal and a second terminal of the associated DC electrical power network.

3. The DC distance protection scheme according to claim 2 wherein the first point is spaced from the first terminal by between 80% and 95% of the total length of the first section.

4. The DC distance protection scheme according to claim 1 wherein each of the protection device, the measurement apparatus and the controller is in use operatively associated with a first terminal of an associated DC electrical power network in which the DC power transmission medium is located, and the controller is programmed to calculate an operating voltage of the DC power transmission medium at a second point in the DC power transmission medium, the second point lying in a second section of the DC power transmission medium extending between second and third terminals of the associated DC electrical power network, the second terminal being spaced from the first terminal of the DC electrical power network by a first section of the DC power transmission medium.

5. The DC distance protection scheme according to claim 4 wherein the second point is spaced from the second terminal by between 20% and 50% of the total length of the second section.

6. The DC distance protection scheme according to claim 1 wherein the controller is programmed to calculate the operating voltage using one of following models of the DC power transmission medium:
   a resistance-inductance model;
   a distributed parameter line model; and
   a frequency dependent distributed parameter line model.

7. The DC distance protection scheme according to claim 1 wherein the controller is programmed to perform the transient comparison between the calculated operating voltage and the measured voltage using one of:
   a magnitude comparison of the said voltages; and a correlation of the voltages.

8. The DC distance protection scheme according to claim 7 wherein the controller is programmed when correlating the said voltages to compare a resulting correlation coefficient against a threshold and to operate the protection device when the correlation coefficient is below the threshold.

9. The DC distance protection scheme according to claim 4, wherein the controller is programmed to operate the protection device if a first transient comparison with respect to a first calculated operating voltage at the first point in the DC power transmission medium meets a predefined criterion or a second transient comparison with respect to a second calculated operating voltage at the second point in the DC power transmission medium meets a predefined criterion.

10. The DC distance protection scheme according to claim 9 wherein the controller is further programmed to delay operating the protection device when the second transient comparison meets the predefined criterion.

11. The DC distance protection scheme according to claim 1 wherein the controller is additionally programmed to operate the protection device upon receipt of an external trip signal.

12. The DC electrical power network comprising a plurality of DC distance protection schemes according to claim 1.

* * * * *